United States Patent [19]
Gross

[11] Patent Number: 4,468,628
[45] Date of Patent: Aug. 28, 1984

[54] DIFFERENTIAL AMPLIFIER WITH HIGH COMMON-MODE REJECTION

[75] Inventor: Winthrop A. Gross, Portland, Oreg.

[73] Assignee: Tektronix, Inc., Beaverton, Oreg.

[21] Appl. No.: 458,383

[22] Filed: Jan. 17, 1983

[51] Int. Cl.³ ............................................. H03F 3/45
[52] U.S. Cl. ................................... 330/258; 330/260
[58] Field of Search ............... 330/252, 258, 259, 260, 330/261

[56] References Cited
U.S. PATENT DOCUMENTS
4,232,271 11/1980 Dobkin et al. ...................... 330/258

Primary Examiner—James B. Mullins
Assistant Examiner—Steven J. Mottola
Attorney, Agent, or Firm—George T. Noe

[57] ABSTRACT

A differential shunt feedback amplifier includes dual shunt feedback paths, with an emitter follower in each feedback path to provide a low impedance output with a well-defined gain. A common-mode current generator responsive to only the common-mode component of an input signal generates a current which offsets base current changes in the emitter followers caused by the common-mode component. The circuit is well suited for either push-pull or single-ended input operation over a wide range of frequencies.

5 Claims, 2 Drawing Figures

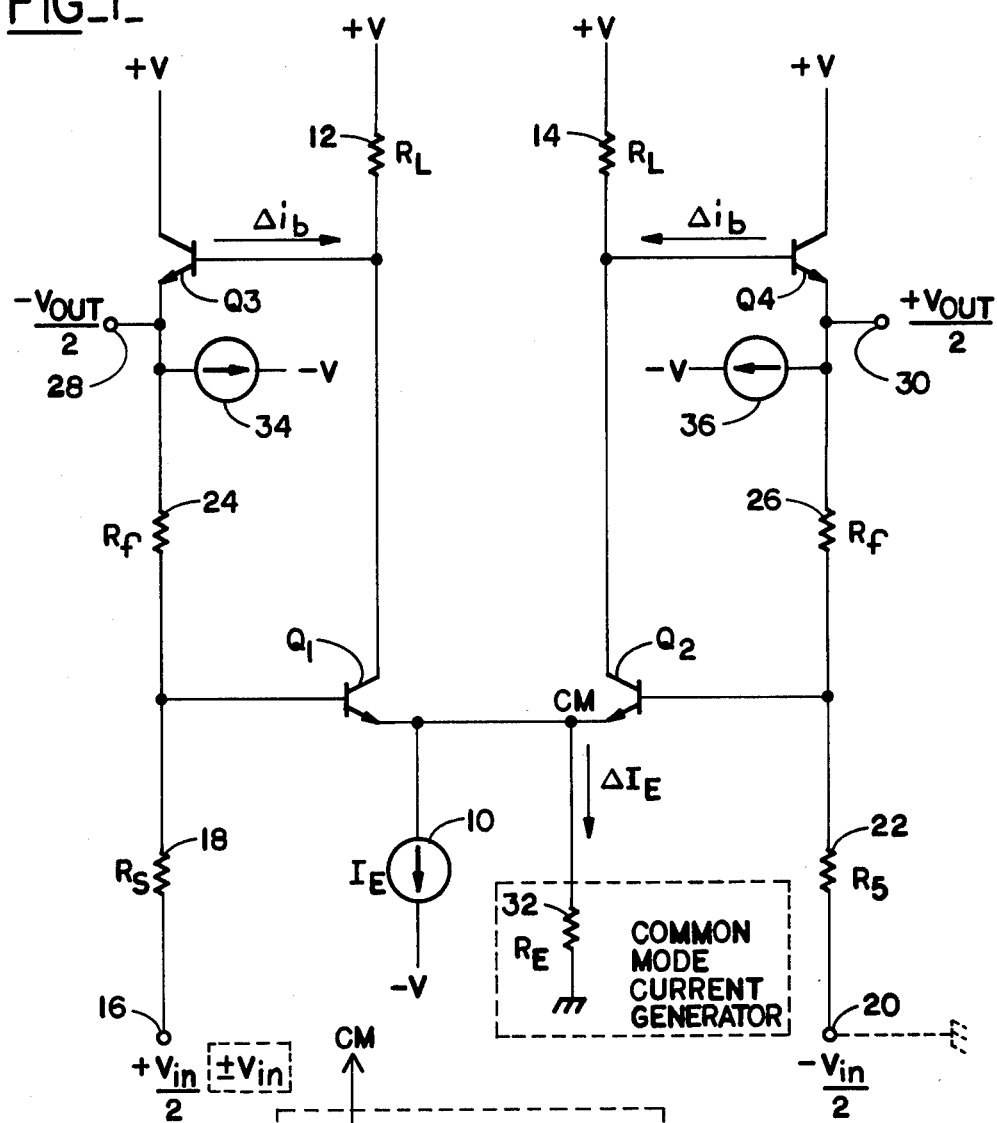

DIFFERENTIAL AMPLIFIER WITH HIGH COMMON-MODE REJECTION

BACKGROUND OF THE INVENTION

The present invention relates generally to differential amplififers, and in particular to a differential shunt feedback amplifier with high common-mode rejection.

Differential amplifiers are well known in the art and are used in many applications in which it is desired to amplify only the differential signal component (the instantaneous difference in signal voltages between a pair of inputs) while rejecting the common-mode component of an input signal. In such amplifiers, one measure of accuracy is the degree to which the common-mode signal component can be cancelled or rejected, and this is known as common-mode rejection (CMR).

One common technique to provide a high common-mode rejection ratio for differential amplifiers comprising an emitter-coupled pair of transistors is to return the common emitters to a reference potential via a very high impedance, such as that exhibited by a constant current source. This technique is known in the art as "long-tailing", and allows the emitter voltage to vary with the common-mode signal without developing a common-mode signal current in the transistors. Thus the collector voltages remain constant with respect to the common-mode signal, effectively rejecting the common-mode signal. However, the utility of this type of circuit is limited because the gain is determined by the characteristics of the transistors themselves and is therefore uncontrollable and unpredictable, and the output impedance is either very high or determined by collector load impedances.

Another common technique to provide a high common-mode rejection ratio for differential amplifiers in general is to tap the common-mode signal from the center of a resistive voltage divider connected across the two inputs to the differential amplifier, apply the common-mode signal to an error amplifier, and then combine in some manner the error signal thus developed with the differential amplifier signal to cancel the common-mode component thereof. However, this type of corrected differential amplifier is complex and generally has a comparatively high power consumption.

SUMMARY OF THE INVENTION

In accordance with the present invention, a differential amplifier with high common-mode rejection comprises an emitter-coupled pair of transistors and associated components which results in a well-defined and predictable voltage gain, low output impedance, and comparatively low power consumption. The circuit arrangment includes a feedback system for each half of the amplifier. Interposed in the feedback loop for each half of the amplifier is an emitter follower transistor to provide a low impedance signal output. The common-mode signal is developed across an impedance, such as a resistance connected to the common emitters of the emitter-coupled pair of transistors, and the value of this resistance is specifically predetermined to provide a common-mode current which exactly offsets the change in base-to-emitter current of the emitter-follower transistors in the feedback loops, cancelling any common-mode signal voltages at the outputs.

As a result of this circuit arrangement, the differential amplifier according to the present invention exhibits a well-defined voltage gain, low output impedance, wide bandwidth, and high rejection of common-mode signals. Moreover, the amplifier is comparatively simple, consumes comparatively little power, and is easily realized in integrated circuit form. Useful applications include those in which single-ended signals are converted to differential signals, as well as differential input situations. An example of such an application is the trigger preamplifier stage of a wide bandwidth oscilloscope.

It is therefore one object of the present invention to provide a novel shunt feedback differential amplifier circuit.

it is another object of the present invention to provide a differential amplifier exhibiting the attributes of well-defined voltage gain and high common-mode signal rejection.

It is a further object of the present invention to provide a differential amplifier with high common-mode signal rejection which is relatively simple, consumes comparatively little power, and is easily realized in integrated-circuit form.

Other objects, features, and advantages of the present invention will become apparent to those having ordinary skill in the art upon a reading of the following description when taken in conjunction with the drawings.

BRIEF DESCRIPTION OF THE DRAWINGS

FIG. 1 is a schematic diagram of a differential amplifier in accordance with the present invention; and FIG. 2 shows a practical embodiment for a common-mode current generator.

DETAILED DESCRIPTION OF THE INVENTION

Referring now to FIG. 1, there is shown a differential shunt feedback amplifier circuit comprising a pair of transistors Q1 and Q2, the emitters of which are coupled together and connected via a constant current sink 10 to a suitable power supply voltage $-V$. The collectors of transistors Q1 and Q2 are connected via load resistors 12 and 14, respectively, to a suitable power supply voltage $+V$. Input signals to the base of transistor Q1 are applied via an input terminal 16 and an input source resistor 18, and, similarly, input signals to the base of transistor Q2 are applied via an input terminal 20 and an input source resistor 22. A phantom ground is indicated at terminal 20, and a signal $\pm V_{in}$ is indicated at terminal 16, illustrating that single-ended input signals as well as push-pull signals may be applied to the differential amplifier herein described. The shunt feedback path for each side of the amplifier includes a resistor 24 coupled from collector to base of transistor Q1 and a resistor 26 coupled from collector to base of transistor Q2. An emitter follower transistor Q3 is interposed between the collector of transistor Q1 and resistor 24 in the shunt feedback path on one side of the amplifier, and an emitter follower transistor Q4 is interposed between the collector of transistor Q2 and resistor 26 in the shunt feedback path on the other side of the amplifier. Output terminals 28 and 30 are connected respectively to the emitters of transistors Q3 and Q4 to provide a low-impedance signal output. A common-mode current generator, represented as a resistor 32, is connected to a common-mode node CM between the emitters of transistors Q1 and Q2. Bias-current sources 34 and 36 are provided for transistors Q3 and Q4, respectively.

In operation, assuming the value $R_L$ of resistors 12 and 14 is substantially larger than $1/gm$ of transistors Q1 and Q2, where gm is the transconductance characteristic of the transistor, differential signals applied between input terminals 16 and 20 will be amplified with a gain of $R_f/R_s$ and appear at output terminals 28 and 30 as $-V_{out}/2$ and $+V_{out}/2$, respectively. Constant current sink 10 provides substantially all of the standing current $I_E$ for transistors Q1 and Q2, and for true differential signals this current $I_E$ does not change, but rather is shifted between transistors Q1 and Q2 to develop the differential output signals. For differential operation, there is little or no current change through the common-mode current generator (resistor 32), and the bases of transistors Q1 and Q2 are virtual grounds.

For a common-mode component present in the input signal, the base current of transistors Q3 and Q4 changes because the virtual ground points at the bases of transistors Q1 and Q2 shift with the common-mode component ($V_{CM}$) of the input signal. The base current change for transistors Q3 and Q4 is given by $$\Delta i_b = - \frac{\Delta V_{CM}}{(R_f + R_s)} \cdot \frac{1}{(\beta + 1)}$$

where $\beta$ is the beta characteristic of transistors Q3 and Q4. Because the voltage at the bases of transistors Q1 and Q2 change equally with the common-mode component, the common-mode component $V_{CM}$ appears at node CM and develops a current $\Delta I_E$ in the common-mode current generator resistor 32. The current change $\Delta I_E$ is given by $$\Delta I_E = \Delta V_{CM} \frac{R_f}{(R_f + R_s)} \cdot \frac{1}{R_E}$$

and this change is split equally between transistors Q1 and Q2, modifying the current $I_E$ produced by constant current sink 10. With the proper value of $R_E$ for resistor 32, the current change $\Delta I_E$ can be made to exactly offset the base current changes $\Delta i_b$ for both of the emitter follower transistors Q3 and Q4. By offsetting these base current changes in this manner, the voltages across the load resistors 12 and 14 do not change with the common-mode signal component, so that the output signals at terminals 28 and 30 have the common-mode component eliminated therefrom as well. Therefore, from the equation $\Delta I_E = -2\Delta i_b$, the value of resistor 32 is determined to be $R_E = \frac{1}{2}(\beta+1)R_f$.

It should be mentioned that $R_s$ and $R_f$ are reasonably low impedance ($\sim 500 \sim$) in order to get good high frequency response. Because of this, the common-mode input signal causes an appreciable change in Q3 and Q4 emitter currents, hence causing $\Delta i_b$. In other words, high common-mode rejection could be achieved by raising $R_f$ and $R_s$, but the bandwidth would suffer due to the input capacitance of Q1 and Q2 forming a pole with $R_f$ paralleled by $R_s$.

FIG. 2 shows an alternative common-mode current generator to replace resistor 32 of FIG. 1. A transistor Q5 has the base thereof connected to node CM between the emitters of transistors Q1 and Q2. The emitter of transistor Q5 is connected to the junction of a resistor 40 and a current sink 42 which are serially disposed between ground and a suitable supply voltage. The value of resistor 40 may suitably be equal to $R_f/2$, so that the equation for the impedance looking into the base of transistor Q5 is $R_{Q5} = (\beta_{Q5}+1)(R_f/2)$. Note that if beta is equal for transistors Q3, Q4, and Q5, then $R_{Q5} = R_E$ as described hereinabove. In fact, for matched transistors, such as may easily be attained by implementing the differential amplifier in integrated form, the proper value of emitter impedance $R_E$ may be provided independent of temperature and process variations. Moreover, since the $f_T$ characteristic would be substantially identical for matched transistors, common-mode rejection provided by the present invention is frequency independent to first order, so that a very high degree of common-mode rejection is provided over a wide bandwidth.

While I have shown and described a preferred embodiment of my invention, it will become apparent to those skilled in the art that many modifications made be made without departing from the scope of my invention in its broader aspects. The appended claims therefore cover all such changes and modifications as fall therewithin.

What I claim as being novel is:

1. A differential amplifier, comprising:
   an input signal path;
   a first and second transistor for receiving said input signal, the emitters of which are coupled together in common;
   a constant current generator connected to the common emitters of said first and second transistors;
   a first and a second shunt feedback path, said first shunt feedback path including a third transistor arranged as an emitter follower connected between the collector and base of said first transistor and said second shunt feedback path including a fourth transistor arranged as an emitter follower connected between the collector and base of said second transistor;
   first and second output terminals coupled to the emitters of said third and fourth transistors, respectively; and
   means coupled to the common emitters of said first and second transistors to generate a current change to offset the base current change of said third and fourth transistors in response to common-mode components of said input signal.

2. A differential amplifier in accordance with claim 1 wherein said current-change generating means comprises impedance means across which said common-mode components of said input signal are developed.

3. A differential amplifier in accordance with claim 2 wherein the value of said impedance means is equal to $\frac{1}{2}(\beta+1)R_f$, wherein $\beta$ is the beta of one of said third and fourth transistors, and $R_f$ is the impedance in one of said shunt feedback paths.

4. A differential amplifier in accordance with claim 3 wherein said impedance means comprises a resistor.

5. A differential amplifier in accordance with claim 3 wherein said impedance means comprises a fifth transistor, the base of which is connected to the common emitters of said first and second transistors, and the emitter of which is connected to at least a resistor.

* * * * *